US011885617B2

(12) United States Patent
Westermark (10) Patent No.: US 11,885,617 B2
(45) Date of Patent: Jan. 30, 2024

(54) GEODETIC ASSEMBLY WITH MAGNETIC ATTACHING ARRANGEMENT

(71) Applicant: Trimble AB, Danderyd (SE)

(72) Inventor: Magnus Westermark, Ekerö (SE)

(73) Assignee: Trimble AB, Danderyd (SE)

(*) Notice: Subject to any disclaimer, the term of this patent is extended or adjusted under 35 U.S.C. 154(b) by 482 days.

(21) Appl. No.: 17/236,253

(22) Filed: Apr. 21, 2021

(65) Prior Publication Data

US 2021/0247185 A1 Aug. 12, 2021

Related U.S. Application Data

(63) Continuation of application No. PCT/EP2018/079834, filed on Oct. 31, 2018.

(51) Int. Cl.
*G01C 15/00* (2006.01)
*F16B 1/00* (2006.01)
(Continued)

(52) U.S. Cl.
CPC ............ *G01C 15/002* (2013.01); *F16B 1/00* (2013.01); *G01D 11/30* (2013.01); *H01F 7/02* (2013.01);
(Continued)

(58) Field of Classification Search
CPC . G01C 15/06; G01C 9/06; G01C 9/32; G01C 2009/066; G01C 19/36; H04B 5/0031; H04B 5/0037; H04W 4/80
See application file for complete search history.

(56) References Cited

U.S. PATENT DOCUMENTS 9,397,719 B1 7/2016 Schmidt
9,800,283 B2 10/2017 Schmidt
(Continued)

FOREIGN PATENT DOCUMENTS

CN 105492864 A 4/2016
EP 1 726 915 A1 11/2006
EP 3 043 538 A1 7/2016

OTHER PUBLICATIONS

International Search Report and Written Opinion for Application No. PCT/EP2018/079834, dated Jul. 12, 2019, 13 pages.
(Continued)

*Primary Examiner* — Yaritza Guadalupe-McCall
(74) *Attorney, Agent, or Firm* — KILPATRICK TOWNSEND & STOCKTON LLP (57) ABSTRACT

Embodiments provide for a geodetic assembly (200) for land surveying. The geodetic assembly (200) may include a first element (210) including a first magnetic unit (270) and a second element (250) including a second magnetic unit (260). The second element may be part of a support structure (240) of the geodetic assembly and is adapted to mate with the first element for supporting a geodetic device (230), the first element being attached to the geodetic device (or vice versa). The second magnetic unit is arranged to interact with the first magnetic unit for locking or unlocking the first element on the support structure. Each of the first magnetic unit and the second magnetic unit is divided in a plurality of regions (320*a-d*, 360*a-d*) arranged in a circular manner such that two adjacent regions have magnetic poles of opposite polarities. The geodetic assembly may further comprise at least one magnetic shield (270) for shielding the geodetic device, or a magnetically sensitive device (280) arranged at the support structure, from the first magnetic unit and the second magnetic unit.

13 Claims, 3 Drawing Sheets

(51) Int. Cl.
*G01D 11/30* (2006.01)
*H01F 7/02* (2006.01)
*H05K 9/00* (2006.01)

(52) U.S. Cl.
CPC ........ *H05K 9/0075* (2013.01); *F16B 2200/83* (2023.08)

(56) References Cited

U.S. PATENT DOCUMENTS

| | | | |
|---|---|---|---|
| 11,342,800 B2 * | 5/2022 | Oro | H04B 5/0031 |
| 11,710,988 B2 * | 7/2023 | Larsson | H02J 50/005 |
| | | | 320/108 |
| 11,722,015 B2 * | 8/2023 | Walton | H04B 5/0031 |
| | | | 320/108 |
| 11,722,016 B2 * | 8/2023 | Jol | H02J 50/90 |
| | | | 320/108 |
| 2016/0178365 A1 | 6/2016 | Faix et al. | |
| 2016/0202056 A1 | 7/2016 | Senger | |
| 2021/0247185 A1 * | 8/2021 | Westermark | G01C 15/00 |

OTHER PUBLICATIONS

Written Opinion of the International Preliminary Examining Authority for Application No. PCT/EP2018/079834, dated Nov. 11, 2020, 7 pages.
International Preliminary Report on Patentability dated Feb. 15, 2021, 8 pages.

* cited by examiner

GEODETIC ASSEMBLY WITH MAGNETIC ATTACHING ARRANGEMENT

CROSS-REFERENCE TO RELATED APPLICATIONS

This application is a continuation of International Application No. PCT/EP2018/079834, filed Oct. 31, 2018, the entire contents of which are incorporated herein by reference in its entirety for all purposes.

TECHNICAL FIELD

The present disclosure relates generally to the field of land surveying and, more particularly, to a geodetic assembly including a magnetic arrangement for attaching a geodetic device, or a geodetic target, to a support structure.

BACKGROUND

Land surveying involves the determination of terrestrial or three-dimensional positions of points and the determination of distances and angles between these points. For this purpose, a surveyor may use a geodetic instrument including an electronic distance measurement unit (EDM unit) which may be integrated in a theodolite or center unit, thereby forming a so-called total station. The surveyor may also use a surveying pole equipped with for example a prism or a reflector acting as a target in order to measure a position and/or a distance from the geodetic instrument to the target. Land surveying may also include the tracking of such a target.

Figure 1:
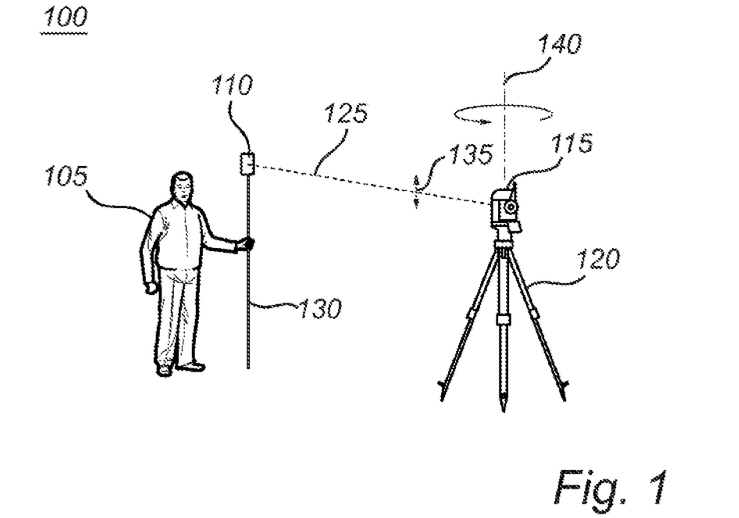
FIG. 1 illustrates a typical scenario of a surveyor using a target mounted on a surveying pole together with a geodetic instrument.

FIG. 1 schematically illustrates a typical scenario 100 of a surveyor 105 using a target 110 mounted on a surveying pole 130 together with a geodetic instrument 115 mounted on a tripod 120. The geodetic instrument 115 may be a total station or a geodetic scanner and may for example be used with non-cooperative targets to measure their positions relative to the geodetic instrument or with cooperative targets for tracking purposes. As mentioned above, the geodetic instrument 115 may have a center unit with an EDM unit for measuring a distance 125 to the target 110. The center unit may be aimed towards the target 110 by rotation in a vertical direction 135 about a first axis (not shown in FIG. 1) and azimuthally about a second axis 140. Depending on the type of measurements to be performed, the surveyor may have to replace the target mounted on the surveying pole. The surveyor may wish to use the surveying pole with a different type of prism, reflector or more generally a different type of geodetic device. The surveying pole therefore needs to provide the possibility of changing the target or geodetic device mounted on it. However, it is also necessary that the target or geodetic device is mounted in a mechanically stable manner. While the use of screws or similar fastening means may provide mechanical stability, such a technique may not be so convenient for the surveyor and even time consuming.

Thus, there is still a need in providing new kinds of surveying poles, and more generally geodetic assemblies, for supporting different types of targets and geodetic devices.

SUMMARY

The present disclosure seeks to provide at least some embodiments of geodetic assemblies which overcome at least some of the above mentioned drawbacks. More specifically, the present disclosure aims at providing at least some embodiments offering a geodetic assembly having a more flexible attaching system for mounting a geodetic device on a support structure of the geodetic assembly.

This and other objects are achieved by means of a geodetic assembly as defined in the appended independent claim. Other embodiments are defined by the dependent claims.

According to some embodiments, there is provided a geodetic assembly for land surveying. The geodetic assembly is based on the use of a magnetic attaching system.

More specifically, the geodetic assembly may include a first element including a first magnetic unit and a second element including a second magnetic unit. The second element may be part of a support structure of the geodetic assembly and may be adapted to mate with the first element for supporting a geodetic device (such as for example a target), the first element being attached to the geodetic device (or vice versa).

The second magnetic unit may be arranged to interact with the first magnetic unit for locking or unlocking the first element on the support structure, thereby locking or unlocking also the geodetic device attached thereto. Each of the first magnetic unit and the second magnetic unit is divided in a plurality of regions arranged in a circular manner such that two adjacent regions have magnetic poles of opposite polarities.

The geodetic assembly may further comprise at least one magnetic shield for shielding the geodetic device, or a magnetically sensitive device arranged at the support structure, from the first magnetic unit and the second magnetic unit.

It will be appreciated that the support structure may be adapted to set the geodetic assembly on a terrain. However, other types of support structures may be used and the geodetic assembly may be placed at other places, such as on top of a vehicle.

Further, in some embodiments, the support structure may be a surveying stand, a surveying tripod or a surveying pole. In particular, the support structure may be a surveying pole extending from a pointing tip to the second element at which the second magnetic unit is arranged. The surveying pole may for example be a telescopic pole with at least two pole sections. Similarly, each one of the legs of the tripod may extend from a point of contact on a terrain or ground to the second element at which the second magnetic unit is arranged.

Further, it will be appreciated that, in use, the support structure is located below the geodetic device. Thus, the support structure including the second element forms a lower part of the geodetic assembly while the first element and the geodetic device attached thereto form an upper part of the geodetic assembly. Accordingly, for mounting the geodetic device on the support structure, the first element is placed on top of the second element.

In accordance with the above, the geodetic device may be unlocked or locked on the support structure via rotation of the first element relative to the second element, or vice versa, such that the first magnetic unit either becomes repelled by, or attracted to, the second magnetic unit.

In some embodiments, the first magnetic unit may be rotatable relative to the second magnetic unit such that the first element is brought in a locked position in which north and south poles of the second magnetic unit are in alignment with (or at least approximatively in alignment with) south and north poles of the first magnetic unit, respectively, and in an unlocked position in which north and south poles of the second magnetic unit are in alignment with (or at least approximatively in alignment with) north and south poles of the first magnetic unit, respectively.

It will be appreciated that when the north and south poles of the second magnetic unit are aligned with (or at least approximatively in alignment with), or placed in front of, the south and north poles of the first magnetic unit, respectively, the two magnetic units will be attracted to each other and the first element will be brought against the second element into a locked position. Unless the first element is rotated relative to the second element such that the respective north and south poles of the first and second magnetic units are not aligned any longer, the first element will remain in place on top of the second element.

Similarly, when the north and south poles of the second magnetic unit are aligned with (or at least approximatively in alignment with), or placed in front of, the north and south poles of the first magnetic unit, respectively, the two magnetic units will be repelled from each other such that the first element can be detached from the second element. Accordingly, from a locked position as described above, an operator can unlock the geodetic device, for example for replacing it with another geodetic device, by rotating the first element relative to the second element.

As an example, each of the first magnetic unit and the second magnetic unit may be a disk divided into a plurality of regions, or sectors, wherein two adjacent sectors have opposite magnetic polarities. Further, the first magnetic unit and the second magnetic unit may in some embodiments be divided in a same number of sectors (or regions). However, the present embodiments and the present examples are not limited to such a requirement and it may be envisaged that the number of sectors or regions differ between the first magnetic unit and the second magnetic unit.

In some embodiments, the first magnetic unit and the second magnetic unit may each be divided in at least two regions. For example, the first magnetic unit and the second magnetic unit may be divided in four, six or eight regions.

It will also be appreciated that the size of the regions of the first magnetic unit and the size of the regions of the second magnetic unit may differ from each other. Similarly, the size of the first magnetic unit, as such, may also differ from the size of the second magnetic unit.

Still, in some embodiments, in order to further improve the stability and reliability of the attaching system, the first magnetic unit and the second magnetic unit may be identical, i.e. of the same size and/or the same shape, with the same number of regions and with the regions also having the same size (and/or the same shape).

It will also be appreciated that the regions may be closely arranged without any spacing between them but, in some other embodiments, there might be a spacing or gap as long as the regions are arranged in a circular manner such that two adjacent regions have opposite magnetic polarities.

Assuming that each of the first magnetic unit and the second magnetic unit is divided into a number of n regions, by rotating the first element by 1/n turn relative to the second element, the first element and the second element may switch from a locked position to an unlocked position, or vice versa (depending on the initial state).

The strength of the magnetic field provided by the magnetic units may be tailored such that a human may unlock the magnetic units from each other by rotation of one of the magnetic units relative to the other by hand while, at the same time, such that it provides mechanical stability such that the position of the geodetic device relative to the support structure in a locked position is fixed. The strength of the force between the first magnetic unit and the second magnetic unit depends on the size of the magnetic units and in particular their volumes.

The use of magnetic units in a geodetic assembly, such as for example a surveying pole, is however controversial in that it may affect the geodetic device itself or another magnetically sensitive device arranged at for example the support structure of the geodetic assembly. It has therefore also been realized that the geodetic assembly may be equipped with a magnetic shield for preventing the geodetic device, or another magnetically sensitive device of the geodetic assembly, from being subject to the magnetic field induced by the first magnetic unit and the second magnetic unit.

According to some embodiments, the magnetic shield may include a ferromagnetic cap arranged at a side of the first magnetic unit opposite to the side of the first magnetic unit that is arranged to interact with a side of the second magnetic unit for locking or unlocking the first element on the support structure. In the present embodiments, the ferromagnetic cap is positioned in the upper part of the geodetic assembly.

More specifically, the ferromagnetic cap may be arranged between the first magnetic unit and the geodetic device.

Accordingly, the geodetic device may be shielded from the magnetic field of the first magnetic unit. In addition, as the second magnetic unit is arranged below the first magnetic unit, or arranged to interact with the side of the first magnetic unit that is opposite to the side at which the geodetic device is arranged, the geodetic device may also be shielded from the magnetic field of the second magnetic unit.

According to some embodiments, the magnetic shield may include a ferromagnetic cap arranged at a side of the second magnetic unit opposite to the side of the second magnetic unit that is arranged to interact with a side of the first magnetic unit for locking or unlocking the first element on the support structure. In the present embodiments, the ferromagnetic cap is positioned in the lower part of the geodetic assembly.

More specifically, the ferromagnetic cap may be arranged between the second magnetic unit and the support structure at which a magnetically sensitive device may be arranged.

In the present embodiments, the geodetic device arranged in the upper part of the geodetic assembly may not be shielded from the magnetic field of the first magnetic unit and the second magnetic unit but any magnetically sensitive device arranged at the support structure, i.e. in the lower part of the geodetic assembly, may be protected from potential magnetic disturbance caused by the first and second magnetic units.

It will be appreciated that the geodetic assembly may include a first ferromagnetic cap arranged at a side of the first magnetic unit opposite to the side of the first magnetic unit that is arranged to interact with a side of the second magnetic unit, i.e. in the upper part of the geodetic assembly, and a second ferromagnetic cap arranged at a side of the second magnetic unit opposite to the side of the second magnetic unit arranged to interact with a side of the first magnetic unit, i.e. in the lower part of the geodetic assembly.

In this case, in a locked position, the first magnetic unit and the second magnetic unit are sandwiched between the first ferromagnetic cap and the second magnetic cap, thereby protecting the geodetic device and any other magnetically sensitive device of the geodetic assembly from magnetic disturbance caused by the first and second magnetic units.

In accordance with some embodiments, as an alternative or in addition to the above described ferromagnetic caps, the first element and the second element may include a body (or housing) at least partly including ferromagnetic material to form the magnetic shield.

In some embodiments, the second element may include a recess in which the second magnetic unit and the magnetic shield may be arranged such that the second magnetic unit is arranged to interact with the first magnetic unit by inserting the first magnetic unit in the recess to lock or unlock the first element on the support structure. In the present embodiments, the first element including the first magnetic unit may be designed to mate with the recess of the second element. In particular, the first element may be designed to fit within the recess of the second element.

In some other embodiments, the first element may include a recess in which the first magnetic unit and the magnetic shield may be arranged such that the first magnetic unit is arranged to interact with the second magnetic unit by inserting the second magnetic unit in the recess to lock or unlock the first element on the support structure. In the present embodiments, the second element including the second magnetic unit may be designed to mate with the recess of the first element. In particular, the second element may be designed to fit within the recess of the first element.

It will be appreciated that, in any of the preceding embodiments, the recess may be made in a ferromagnetic material such that the walls of the recess act as magnetic shield.

In some embodiments, the second magnetic unit may be mounted in a fixed position relative to the support structure. In the present embodiments, the first element may then be arranged, and/or designed, such that it can rotate relative to the second magnetic unit fixed at the support structure.

In some embodiments, the geodetic device or the magnetically sensitive device may include at least one of a prism, a reflector, a compass, a surveying control unit or a global navigation satellite system, GNSS, receiver. It will be appreciated that the geodetic device or target arranged on, or attached to, the first element may be a combination of a prism and a GNSS receiver, or the like. In other words, the geodetic device or target generally comprises a device that is sensitive to magnetic disturbance.

Although it is in the above referred to a geodetic assembly, it will be appreciated that, if the support structure is a (surveying) pole or rod, the geodetic assembly as a whole may also be referred to as a surveying pole, wherein the surveying pole has a lower part including the support structure (the pole) itself, with the second element including the second magnetic unit, and an upper part including the geodetic device or target, with the first element including the first magnetic unit.

It is noted that other embodiments using all possible combinations of features recited in the above described embodiments may be envisaged. Thus, the present disclosure also relates to all possible combinations of features mentioned herein. Any embodiment described herein may be combinable with other embodiments also described herein, and the present disclosure relates to all combinations of features.

BRIEF DESCRIPTION OF THE DRAWINGS

Exemplifying embodiments will now be described in more detail, with reference to the following appended drawings.

DETAILED DESCRIPTION

As illustrated in the figures, the sizes of the elements and regions may be exaggerated for illustrative purposes and, thus, are provided to illustrate the general structures of the embodiments. Like reference numerals refer to like elements throughout.

Exemplifying embodiments will now be described more fully hereinafter with reference to the accompanying drawings, in which currently preferred embodiments are shown. The invention may, however, be embodied in many different forms and should not be construed as limited to the embodiments set forth herein; rather, these embodiments are provided for thoroughness and completeness, and fully convey the scope of the invention to the skilled person.

Figure 2:
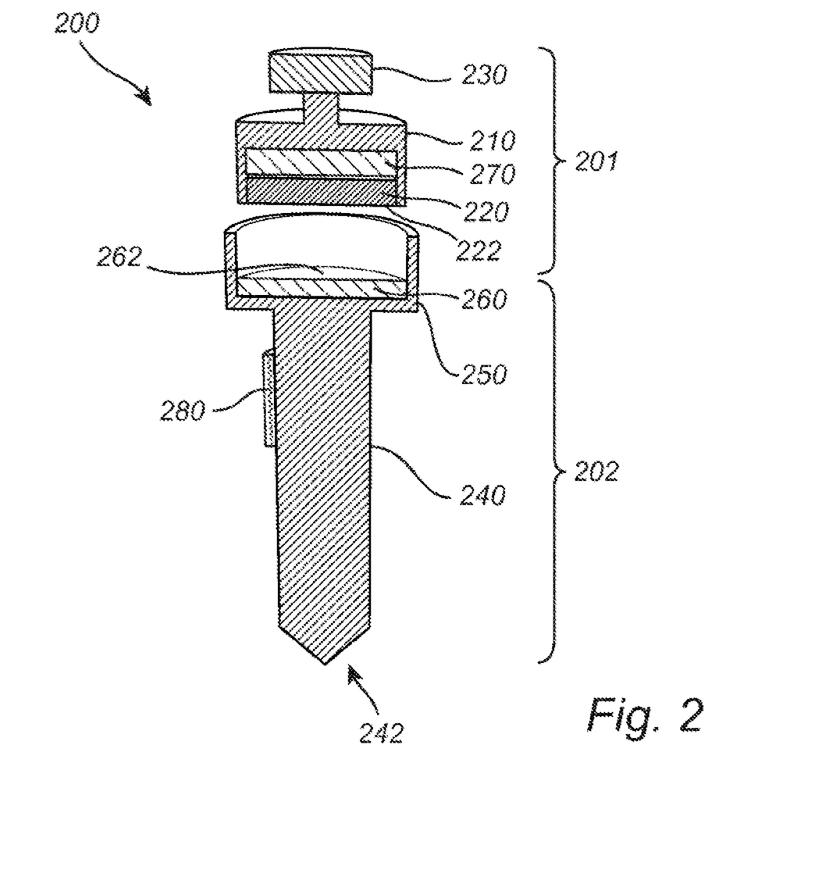
FIG. 2 shows a schematic view of a geodetic assembly in accordance with an embodiment.

With reference to FIG. 2, a geodetic assembly 200 according to an embodiment is described.

FIG. 2 shows a geodetic assembly 200 which may for example be a surveying pole.

The geodetic assembly 200 comprises an upper part 201 with a first element 210 including a first magnetic unit 220. In the present example, the first element 210 includes a cavity or recess in which the first magnetic unit 220 may be lodged. It will be appreciated that other configurations may be used and that the form of the first element 210 may vary. As another example, the first element 210 may be a material block on which the first magnetic unit 220 is fixed.

A geodetic device 230, such as for example a prism, a reflector, a GNSS receiver, a compass, a surveying control unit and/or another type of surveying accessory, may be attached to the first element 210.

The geodetic assembly 200 comprises also a lower part 202 including a support structure 240 in the form of a pole or rod. The pole may include a pointing tip 242 for positioning the support structure at a terrain point. However, other kinds of support structure may be use depending on the application. For example, the support structure may be adapted for positioning the geodetic assembly on a vehicle.

The support structure 240 of the lower part 201 includes also a second element 250 adapted to mate with the first element 210 for supporting the geodetic device 230. In the embodiment shown in FIG. 2, the second element 250 includes a recess in which the first element 210 is arranged to fit. The first element 210 may therefore be inserted within the recess of the second element 250. This is only one example and other geometries of the first element 210 and the second element 250 may be used such that the first element 210 and the second element 250 are arranged to mate.

As will be further explained with reference to FIGS. 3 and 4 in the following, the first magnetic unit and the second magnetic unit may comprise a plurality of regions arranged in a circular manner such that two adjacent regions have magnetic poles of opposite polarities. When brought in proximity to each other, the first magnetic unit and the second magnetic unit may either be attracted or repulsed.

Still referring to FIG. 2, the geodetic assembly 200 may also include a ferromagnetic cap 270 acting as a magnetic shield such that the geodetic device 230, which may be sensitive to magnetic disturbances, is shielded from the magnetic field of the first magnetic unit 220 and the magnetic field of the second magnetic unit 260. The ferromagnetic cap 270 may for example be made of iron. The ferromagnetic cap 270 may be lodged in the cavity or recess of the first element 210 such that the ferromagnetic cap 270 is sandwiched between the first magnetic unit 220 and the bottom of the cavity of the first element 210. Again, other geometries may be envisaged and, according to another example, the ferromagnetic cap 270 may be an integrated part of the material block of the first element 210 on which the first magnetic unit 220 may be fixed. The magnetic shield 270 is arranged at a side of the first magnetic unit 220 opposite to the side 222 arranged to interact with a side 262 of the second magnetic unit 260 for locking or unlocking the first element 210 on the support structure 240.

FIG. 2 illustrates also that other surveying accessories or surveying devices 280 may be attached to the support structure 240 of the geodetic assembly 200. The operation of such surveying accessories or devices 280 may also be sensitive to the presence of a magnetic field and in other embodiments, as will be further illustrated with reference to FIG. 4, an additional magnetic shield (not shown in FIG. 2) may be provided between the second magnetic unit 260 and the support structure 240 in order to protect the surveying accessory 280.

Figure 5:
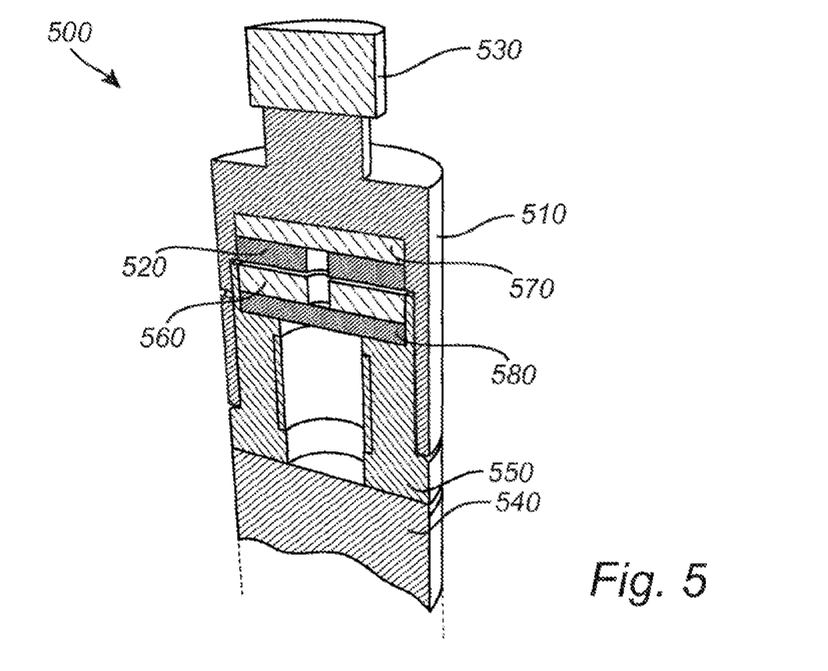
FIG. 5 shows a geodetic assembly in accordance with an embodiment.

In general, a magnetic shield may be provided between the first magnetic unit 220 and the geodetic device 230 (as shown in FIG. 2) and another magnetic shield may be provided between the second magnetic unit 260 and the support structure 240 (not shown in FIG. 2 but in FIG. 5).

Figure 3:
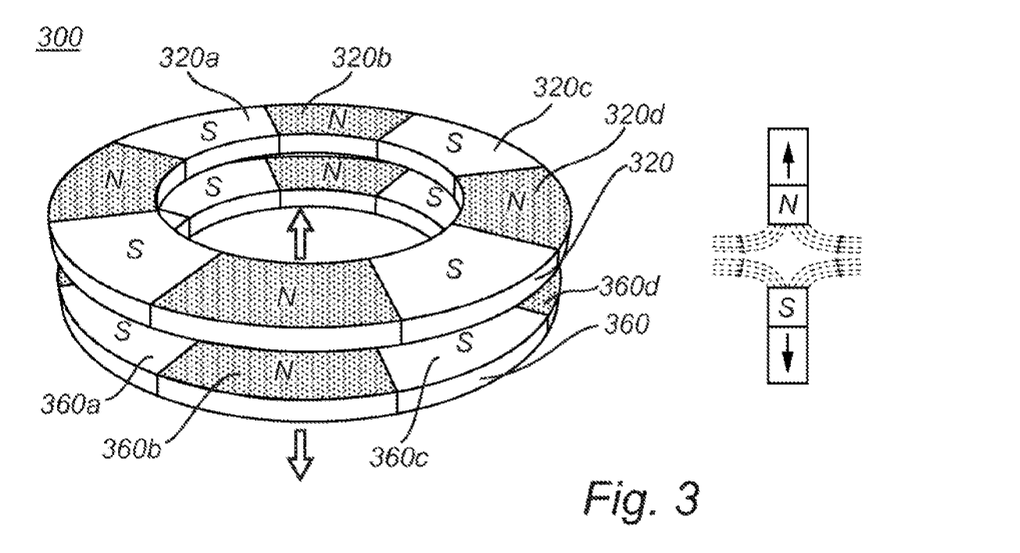
FIG. 3 shows a pair of magnet units in an unlocked state, in accordance with an embodiment.
Figure 4:
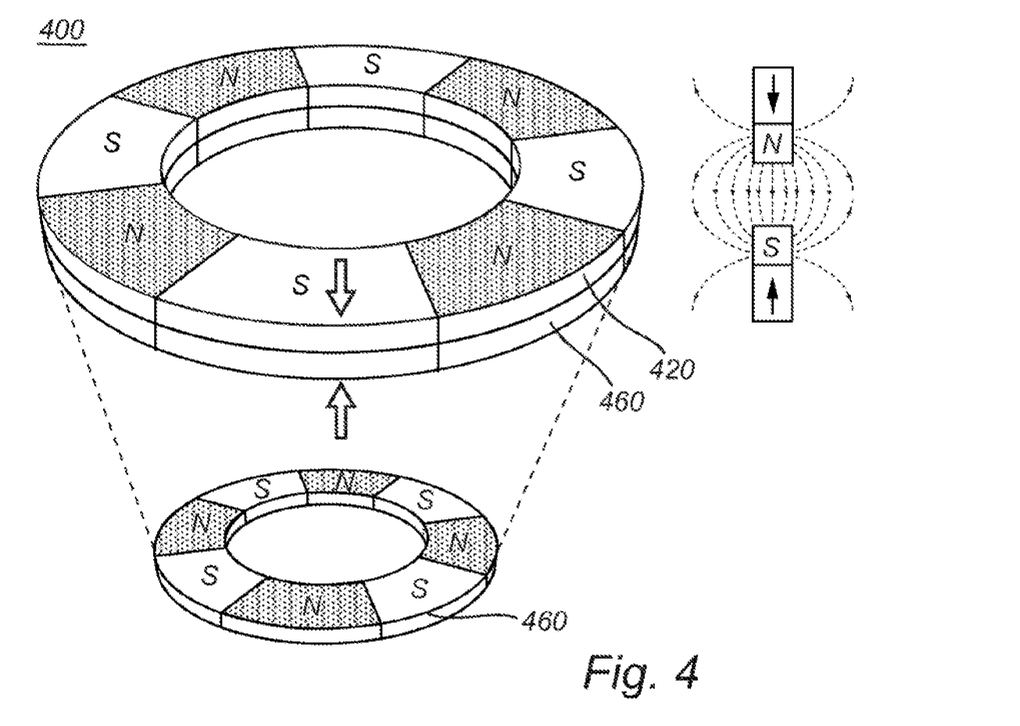
FIG. 4 shows a pair of magnet units in a locked state, in accordance with an embodiment.

With reference to FIGS. 3 and 4, the principle for locking and unlocking the first element on the support structure will be described.

FIGS. 3 and 4 show two magnetic units in the form of two disks, each disk being divided in eight regions or sections. Another geometry than a disk may however be used for the magnetic units and each of the disks may be divided in another number of sections such as for example four, six or ten. For example, each of the magnetic units may include four sections arranged in the form of a cross, thereby still allowing by rotation of one of the magnetic units relative to the other to face a north section of a magnetic unit to either one of a north or south section of the other magnetic unit.

FIG. 3 illustrates a scenario 300 in which the first magnetic unit 320 may be a disk divided in eight sectors (or sections). Four of the eight sectors are denoted as 320a, 320b, 320c and 320d in the drawing, the other sectors being not denoted in order not to obscure the drawing. The sectors are arranged such that two adjacent sectors, such as sectors 320a and 320b, have poles of opposite polarities. In particular, the sector denoted 320a corresponds to a south pole, the sector denoted 320b corresponds to a north pole, the sector denoted 320c corresponds to a south pole and the sector 320d corresponds to a north pole and so forth.

The first magnetic unit 320 may be used as the first magnetic unit 220 in the geodetic assembly 200 described with reference to FIG. 2.

Similarly, the second magnetic unit 360 shown in FIG. 3 may be used as the second magnetic unit 260 in the geodetic assembly 200 described with reference to FIG. 2.

The second magnetic unit 360 may be, as such, equivalent to the first magnetic unit 320 described above, wherein the second magnetic unit 360 is shaped as a disk and divided in eight sections with two adjacent sections, such as for example sections 360a and 360b, or even sections 360c and 360d, being of opposite magnetic polarities.

As illustrated in FIG. 3, when two magnets are placed in proximity to each other, if the two poles having the same polarity are facing each other, the two magnets will be repelled from each other (repulsion force between two poles of the same kind).

Accordingly, FIG. 3 illustrates the scenario 300 in which the two magnetic units 320 and 360 are in an unlocked state.

FIG. 4 illustrates the opposite scenario 400 in which the two magnetic units 420 and 460 are in a locked state as the two magnetic units have been rotated by a ⅛ turn (or an odd number of ⅛ turn) relative to each other such that a south pole of the magnetic unit 420 is aligned (or faces) a north pole of the magnetic unit 460. The first magnetic unit 420 shown in FIG. 4 may be equivalent to the first magnetic unit 320 described with reference to FIG. 3 and the second magnetic unit 460 shown in FIG. 4 may be equivalent to the second magnetic unit 360 described with reference to FIG. 3.

Accordingly, still referring to FIGS. 3 and 4, using such magnetic units in for example the geodetic assembly 200 shown in FIG. 2, the first element 210 may be brought by rotation into a locked position in which north and south poles of the second magnetic unit 460 are in alignment, or at least approximatively in alignment, with south and north poles of the first magnetic 30 unit 420, respectively (see FIG. 4), and into an unlocked position in which north and south poles of the second magnetic unit 460 are no longer aligned with south and north poles of the first magnetic unit (FIG. 3).

With reference to FIG. 5, a geodetic assembly according to another embodiment is described.

FIG. 5 shows a geodetic assembly 500 including an upper part with a first element 510 and a lower part with a support structure 540 including a second element 550. A geodetic device 530 is attached to, or mounted on, the first element 510.

The geodetic assembly 500 may be equivalent to the geodetic assembly 200 described with reference to FIG. 2 except for the following.

The first element 510 includes a recess in which a first magnetic unit 520 and a ferromagnetic shield 570 (for example made of iron) are lodged, similar to what is shown in FIG. 2, but, in this embodiment, the recess is arranged to also receive the second element 550 of the lower part of the geodetic assembly 500.

Thus, while FIG. 2 shows an embodiment in which it is the second element of the geodetic assembly that has a recess to mate with (or receive) the first element, the embodiment shown in FIG. 5 shows a geodetic assembly in which it is the first element that has a recess to mate with (or receive) the second element.

Further, FIG. 5 shows that the geodetic assembly 500 may also include a ferromagnetic cap 580 (for example made of iron) arranged at a side of the second magnetic unit 560 opposite to the side of the second magnetic unit 560 that is arranged to interact with a side of the first magnetic unit 520 for locking or unlocking the first element 510 on the support structure 540.

Accordingly, the geodetic assembly 500 may include a first ferromagnetic cap 570 arranged between the first magnetic unit 520 and the geodetic device 530 and a second ferromagnetic cap 580 arranged between the second magnetic unit 580 and the support structure 540 (or between the second magnetic unit 580 and the second element 550).

Accordingly, referring to for example FIG. 2 showing the presence of a magnetically sensitive device on the support structure, the present embodiment provides a magnetic shield both for the geodetic device 530 and a magnetically sensitive device (not shown in FIG. 5) attached to, or integrated in, the support structure 540.

The locking and unlocking principle of the geodetic assembly 500 may be similar to what has been described above with reference to FIGS. 3 and 4.

Figure 6:
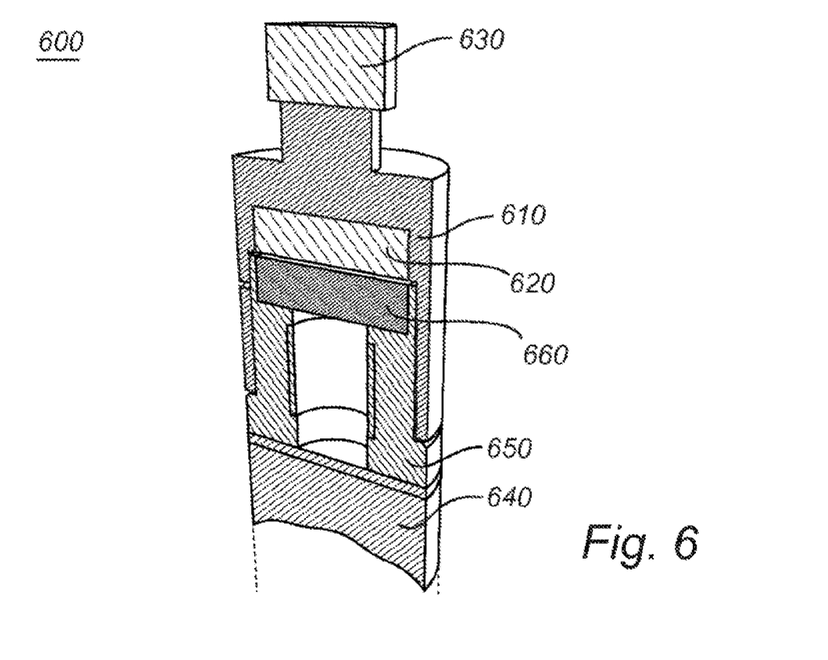
FIG. 6 shows a geodetic assembly in accordance with yet another embodiment.

With reference to FIG. 6, a geodetic assembly according to yet another embodiment is described.

The geodetic assembly 600 shown in FIG. 6 may be equivalent to the geodetic assembly 500 described with reference to FIG. 5 with a lower part including a support structure 640 with a second element 650 and an upper part including a first element 610 to which a geodetic device 630 is attached. However, in the present embodiment, the first element 610 and the second element 650 do not include a ferromagnetic cap. Instead, either one, or each, of the first element and the second element may at least partly be made of a ferromagnetic material (for example iron) such that the body of the first element 610 and the body of the second element 650 may act as magnetic shield.

In this embodiment, the first element 610 includes a first magnetic unit 620. The first magnetic unit 620 may be attached to the first element 610 or lodged in a recess of the first element 610, as shown in FIG. 6.

Similarly, the second element 650 may include a second magnetic unit 660 arranged to interact with the first magnetic unit 620 for locking or unlocking the first element 610 (and the geodetic device or accessory 630 attached thereto) on the support structure 640. The second magnetic unit 660 may be attached to the second element 650 or lodged in a recess the second element 650, as shown in FIG. 6.

It will also be appreciated that the use of ferromagnetic material to form the first element and the second element may be in addition to the use of one or more ferromagnetic caps, such as described with reference to FIGS. 2 and 5 for example.

In some embodiments, the second magnetic unit may be mounted in a fixed position relative to the support structure. It will be appreciated that, depending on the types of support structure, it may be more convenient for a surveyor to rotate the first element than to rotate the whole support structure (in particular if it is a tripod or the like).

The person skilled in the art realizes that the present invention by no means is limited to the preferred embodiments described above. On the contrary, many modifications and variations are possible within the scope of the appended claims. For example, although it has been referred to a pole for the support structure in some of the embodiments, it will be appreciated that the support structure may be any kind of surveying stands, tripods or the like.

Although features and elements are described above in particular combinations, each feature or element can be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A geodetic assembly for land surveying, said geodetic assembly including:
   a first element including a first magnetic unit, said first element being attached to a geodetic device; and
   a support structure including a second element adapted to mate with said first element for supporting said geodetic device;
   wherein the second element includes a second magnetic unit arranged to interact with said first magnetic unit for locking or unlocking said first element on said support structure;
   wherein each of said first magnetic unit and said second magnetic unit is divided in a plurality of regions arranged in a circular manner such that two adjacent regions have magnetic poles of opposite polarities;
   wherein said first magnetic unit is rotatable relative to said second magnetic unit such that the first element is brought in a locked position in which north and south poles of the second magnetic unit are in alignment, or at least or at least approximately in alignment, with south and north poles of the first magnetic unit, respectively, and in an unlocked position in which north and south poles of the second magnetic unit are in alignment, or at least approximately in alignment, with north and south poles of the first magnetic unit, respectively; and
   wherein said geodetic assembly further comprises at least one magnetic shield for shielding said geodetic device from said first magnetic unit and said second magnetic unit.

2. The geodetic assembly of claim 1, wherein said at least one magnetic shield includes a ferromagnetic cap arranged at a side of the first magnetic unit opposite to the side of the first magnetic unit that is arranged to interact with a side of the second magnetic unit for locking or unlocking said first element on said support structure.

3. The geodetic assembly of claim 1, wherein said at least one magnetic shield includes a ferromagnetic cap arranged at a side of the second magnetic unit opposite to the side of the second magnetic unit that is arranged to interact with a side of the first magnetic unit for locking or unlocking said first element on said support structure.

4. The geodetic assembly of claim 1, wherein said at least one magnetic shield includes a ferromagnetic cap arranged between said first magnetic unit and said geodetic device.

5. The geodetic assembly of claim 1, wherein said at least one magnetic shield includes a ferromagnetic cap arranged between said second magnetic unit and said magnetically sensitive device arranged at said support structure.

6. The geodetic assembly of claim 1, wherein at least one of said first element and said second element includes a body at least partly including ferromagnetic material to form said at least one magnetic shield.

7. The geodetic assembly of claim 1, wherein the first magnetic unit and the second magnetic unit are divided in a same number of regions.

8. The geodetic assembly of claim 1, wherein the first magnetic unit and the second magnetic unit are each divided in at least two regions.

9. The geodetic assembly of claim 1, wherein said second element includes a recess in which said second magnetic unit and said at least one magnetic shield are arranged such that said second magnetic unit is arranged to interact with said first magnetic unit by inserting said first magnetic unit in said recess to lock or unlock said first element on said support structure.

10. The geodetic assembly of claim 1, wherein said first element includes a recess in which said first magnetic unit and said at least one magnetic shield are arranged such that said first magnetic unit is arranged to interact with said second magnetic unit by inserting said second magnetic unit in said recess to lock or unlock said first element on said support structure.

11. The geodetic assembly of claim 1, wherein said geodetic device includes at least one of a prism, a reflector, a compass, a surveying control unit or a global navigation satellite system, GNSS, receiver.

12. The geodetic assembly of claim 1, wherein the support structure is a surveying stand, a surveying tripod or a surveying pole.

13. The geodetic assembly of claim 1, wherein said second magnetic unit is mounted in a fixed position relative to said support structure.

* * * * *